US011830660B2

(12) United States Patent
Jeon

(10) Patent No.: US 11,830,660 B2
(45) Date of Patent: Nov. 28, 2023

(54) COIL ELECTRONIC COMPONENT

(71) Applicant: SAMSUNG ELECTRO-MECHANICS CO., LTD., Suwon-si (KR)

(72) Inventor: Hyung Sang Jeon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 1027 days.

(21) Appl. No.: 16/601,894

(22) Filed: Oct. 15, 2019

(65) Prior Publication Data

US 2020/0335263 A1 Oct. 22, 2020

(30) Foreign Application Priority Data

Apr. 16, 2019 (KR) ........................ 10-2019-0044388

(51) Int. Cl.
*H01F 27/28* (2006.01)
*H01F 27/29* (2006.01)
(Continued)

(52) U.S. Cl.
CPC ......... *H01F 27/29* (2013.01); *H01F 27/2804* (2013.01); *H01F 27/323* (2013.01);
(Continued)

(58) Field of Classification Search
CPC .... H01F 27/29; H01F 27/2804; H01F 27/323; H01F 2027/2809; H01F 17/0013;
(Continued)

(56) References Cited

U.S. PATENT DOCUMENTS

| | | | | |
|---|---|---|---|---|
| 6,504,466 B1 * | 1/2003 | Katsurada | H01F 17/0013 336/200 |
| 8,514,049 B2 * | 8/2013 | Sugiyama | H01F 27/34 336/200 |

(Continued)

FOREIGN PATENT DOCUMENTS

| | | |
|---|---|---|
| CN | 100428378 C | 10/2008 |
| CN | 102610388 A | 7/2012 |

(Continued)

OTHER PUBLICATIONS

Office Action issued in corresponding Chinese Patent Application No. 201911323016.5 dated Aug. 4, 2021, with English translation.

(Continued)

*Primary Examiner* — Mang Tin Bik Lian
(74) *Attorney, Agent, or Firm* — Morgan, Lewis & Bockius LLP

(57) ABSTRACT

A coil electronic component is provided, the coil electronic component including a body having a laminate structure formed of a plurality of conductor patterns disposed therein, and including an insulating layer disposed between the plurality of conductor patterns, and an external electrode disposed externally of the body. Portions of the plurality of conductor patterns include a coil pattern and a lead-out pattern connecting the coil pattern and the external electrode, the lead-out pattern includes a first metal layer and a second metal layer disposed on the first metal layer, and a pore density of the first metal layer is higher than a pore density of the second metal layer.

16 Claims, 7 Drawing Sheets

I-I'

A

(51) Int. Cl.

| | |
|---|---|
| ***H01F 27/32*** | (2006.01) |
| ***H01F 41/04*** | (2006.01) |
| ***H01F 41/12*** | (2006.01) |

(52) U.S. Cl.
CPC ......... *H01F 41/043* (2013.01); *H01F 41/122* (2013.01); *H01F 2027/2809* (2013.01)

(58) Field of Classification Search
CPC . H01F 27/292; H01F 5/04; H01F 5/06; H01F 2017/002; H01F 2027/297
See application file for complete search history.

(56) References Cited

U.S. PATENT DOCUMENTS

| | | | | |
|---|---|---|---|---|
| 2004/0084131 | A1* | 5/2004 | Konoue | H01F 41/046 156/89.12 |
| 2005/0083637 | A1 | 4/2005 | Yoshll et al. | |
| 2009/0278649 | A1* | 11/2009 | Tatsukawa | H01F 41/0233 336/200 |
| 2012/0188682 | A1 | 7/2012 | Sato et al. | |
| 2014/0002224 | A1 | 1/2014 | An et al. | |
| 2017/0330673 | A1* | 11/2017 | Sato | H01F 27/2804 |
| 2017/0330674 | A1 | 11/2017 | Lee et al. | |
| 2018/0033540 | A1 | 2/2018 | Lee et al. | |
| 2018/0090266 | A1 | 3/2018 | Sano et al. | |
| 2018/0122548 | A1 | 5/2018 | Kim et al. | |
| 2018/0158584 | A1 | 6/2018 | Park et al. | |
| 2018/0308617 | A1 | 10/2018 | Ha et al. | |
| 2019/0074131 | A1* | 3/2019 | Yamanaka | H01F 27/2804 |
| 2019/0096552 | A1 | 3/2019 | Lee et al. | |
| 2019/0228899 | A1* | 7/2019 | Maki | H01F 41/046 |
| 2020/0335254 | A1* | 10/2020 | Park | H01L 23/645 |

FOREIGN PATENT DOCUMENTS

| | | | |
|---|---|---|---|
| CN | 103515047 | A | 1/2014 |
| CN | 204288997 | U | 4/2015 |
| CN | 106486267 | A | 3/2017 |
| CN | 107369536 | A | 11/2017 |
| CN | 107658095 | A | 2/2018 |
| CN | 108154991 | A | 6/2018 |
| CN | 109559867 | A | 4/2019 |
| KR | 10-2015-0033343 | A | 4/2015 |
| KR | 10-2018-0117464 | A | 10/2018 |

OTHER PUBLICATIONS

Research on Inductor of Electromagnetic Resonant Micro-Pump, Dianzhong Wen, "Study on Electromagnetic Resonant Micropump Inductor Coil Assembly", Chinese Journal of Sensors and Actuators, vol. 20, No. 5, May 2007, pp. 1034-1037, with English abstract.

* cited by examiner

COIL ELECTRONIC COMPONENT

CROSS-REFERENCE TO RELATED APPLICATION(S)

This application claims benefit of priority to Korean Patent Application No. 10-2019-0044388 filed on Apr. 16, 2019 in the Korean Intellectual Property Office, the disclosure of which is incorporated herein by reference in its entirety.

TECHNICAL FIELD

The present disclosure relates to a coil electronic component.

BACKGROUND

A coil electronic component or an inductor is one type of component included in an electronic circuit along with a resistor and a condenser. An inductor may be formed by coiling or printing a coil on a ferrite core and forming electrodes on both ends thereof, and may be used as a component for removing noise or used as a component of an LC resonance circuit. There may be various types of inductor, such as a multilayer inductor, a coiled inductor, a thin film inductor, and the like, depending on a form of a coil.

A multilayer inductor may be manufactured by layering a plurality of coil layers, pressurizing the coil layers, and sintering the laminate of the coil layers. During the sintering, a contact area between a lead-out portion of the coil layer and an external electrode may decrease. As the contact area between the lead-out portion and the external electrode decreases, properties of an inductor, such as direct current resistance, and the like, may degrade.

SUMMARY

An aspect of the present disclosure is to provide a coil electronic component which may secure a sufficient contact area between a lead-out portion and an external electrode. Accordingly, direct current resistance of a coil electronic component may improve, and structural stability may also improve.

According to an aspect of the present disclosure, a coil electronic component is provided, the coil electronic component including a body having a laminate structure formed of a plurality of conductor patterns disposed therein, and including an insulating layer disposed between the plurality of conductor patterns, and an external electrode disposed externally of the body. Portions of the plurality of conductor patterns include a coil pattern and a lead-out pattern connecting the coil pattern and the external electrode, the lead-out pattern includes a first metal layer and a second metal layer disposed on the first metal layer, and a pore density of the first metal layer is higher than a pore density of the second metal layer.

A thickness of the coil pattern may be greater than a thickness of the first metal layer.

A thickness of the first metal layer may be greater than a thickness of the second metal layer.

A thickness of the coil pattern may be less than a sum of thicknesses of the first and second metal layers.

A thickness of the coil pattern may be the same as a sum of thicknesses of the first and second metal layers.

A thickness of the coil pattern may be the same as a thickness of the first metal layer.

The insulating layer may include a sintered ferrite body.

The lead-out pattern may include a sintered metal body.

The sintered metal body may include an Ag component.

Portions of pores of the first and second metal layers may be voids.

Portions of pores of the first and second metal layers may be filled with an organic material.

A portion of the second metal layer may cover at least portions of side surfaces and a lower surface of the first metal layer.

A width of the lead-out pattern may be greater than a width of the coil pattern.

The second metal layer may be composed of a material different from the first metal layer.

The first metal layer and the coil pattern may be composed of the same material.

An average size of pores in the first metal layer may be greater than an average size of pores in the second metal layer.

According to another aspect of the present disclosure, a coil electronic component is provided, the coil electronic component including a body including a laminate structure including a plurality of conductor patterns disposed therein, and an insulating layer disposed between the plurality of conductor patterns; and an external electrode disposed on the body. Portions of the plurality of conductor patterns comprise a coil pattern and a lead-out pattern connecting the coil pattern and the external electrode to each other. The lead-out pattern comprises a first metal layer and a second metal layer disposed on the first metal layer, and the first metal layer and the second metal layer are composed of different materials.

A thickness of the coil pattern may be less than a sum of thicknesses of the first and second metal layers.

A portion of the second metal layer may cover at least portions of side surfaces and a lower surface of the first metal layer.

The first metal layer and the coil pattern may be composed of the same material.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
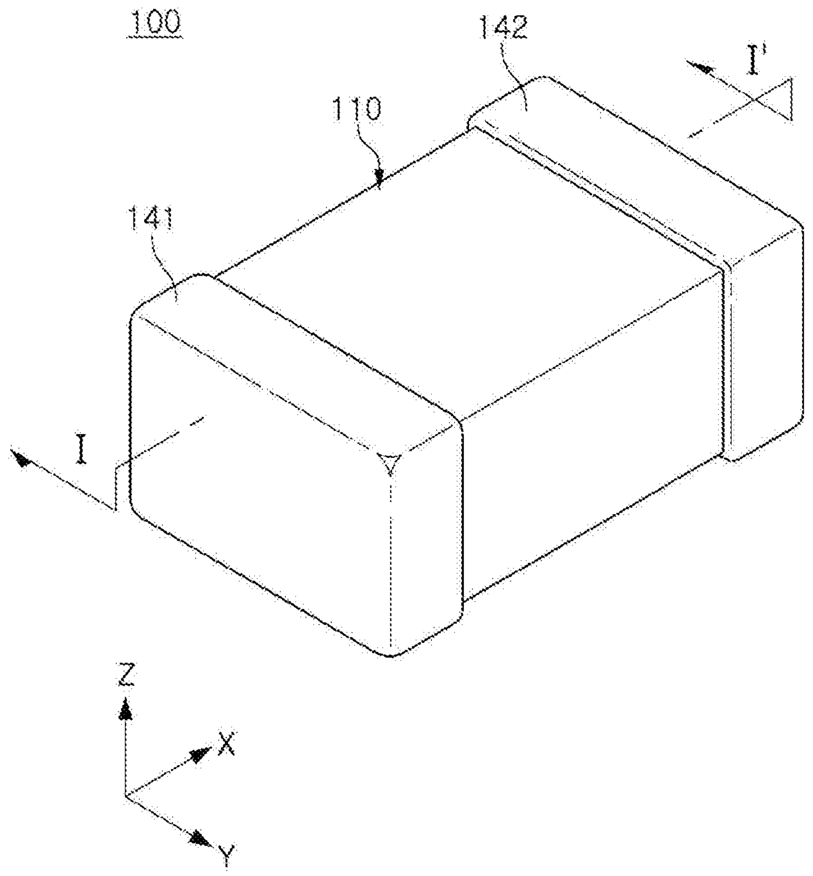
FIGS. 1 and 2 are a perspective diagram and an exploded perspective diagram, respectively, which illustrate a coil electronic component according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Accordingly, shapes and sizes of the elements in the drawings can be exaggerated for clear description. Also, elements having the same function within the scope of the same concept represented in the drawing of each exemplary embodiment will be described using the same reference numeral.

In the drawings, irreverent descriptions will be omitted to clearly describe the present disclosure, and to clearly express a plurality of layers and areas, thicknesses may be magnified. The same elements having the same function within the scope of the same concept will be described with use of the same reference numeral. Further, throughout the specification, it will be understood that when a part "includes" an element, it can further include another element, not excluding another element, unless otherwise indicated.

Figure 2:
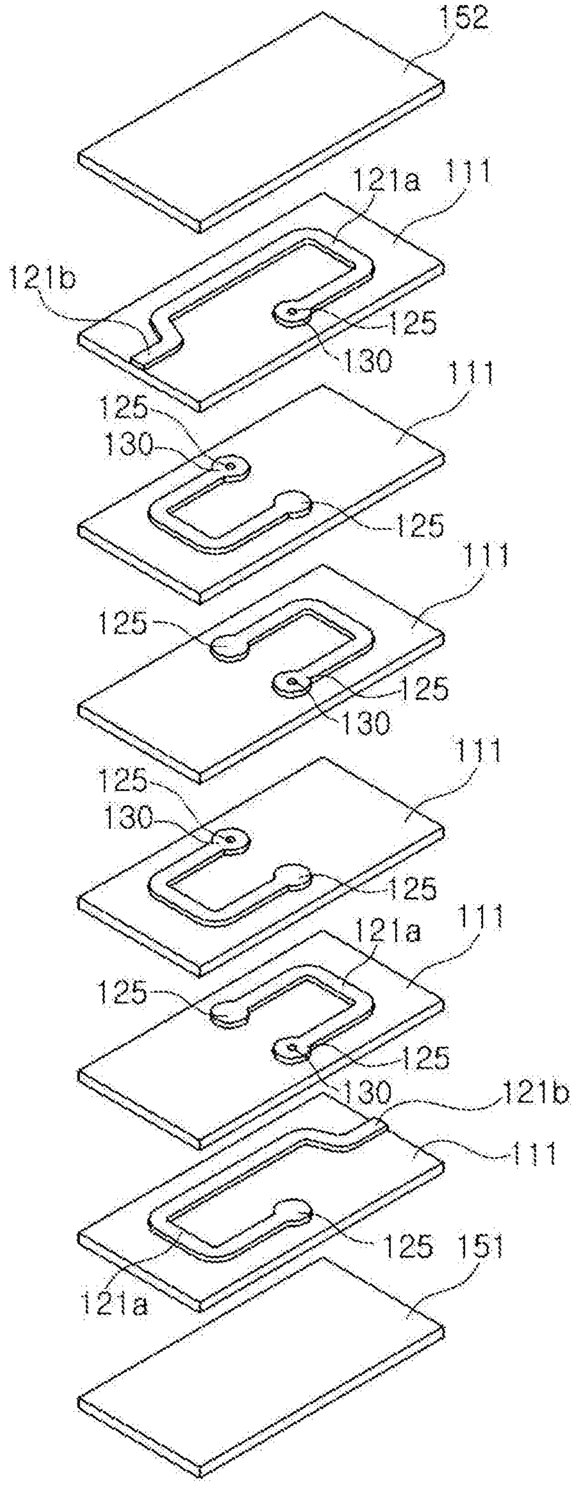
Figure 3:
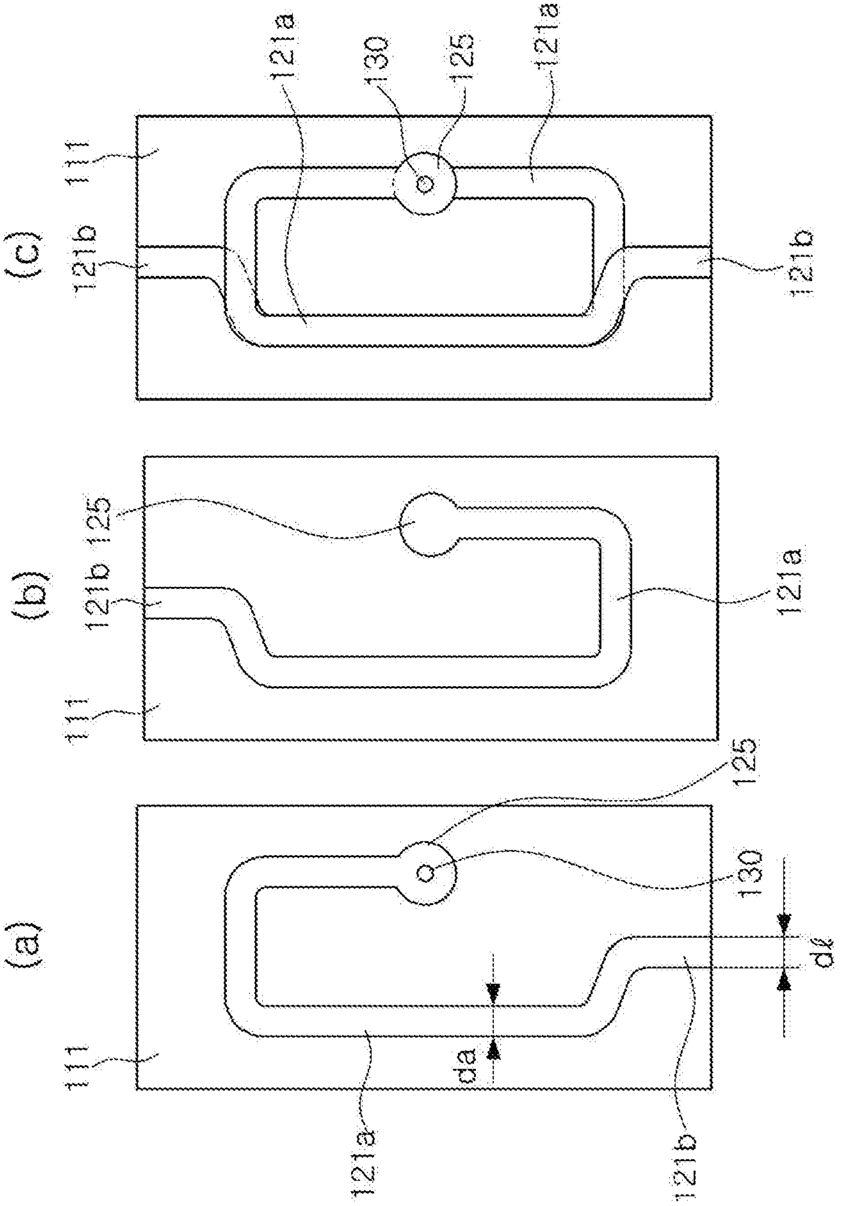
FIGS. 3 and 4 are plan diagrams illustrating an example of a conductor pattern employable in a coil electronic component illustrated in FIG. 1.
Figure 4:
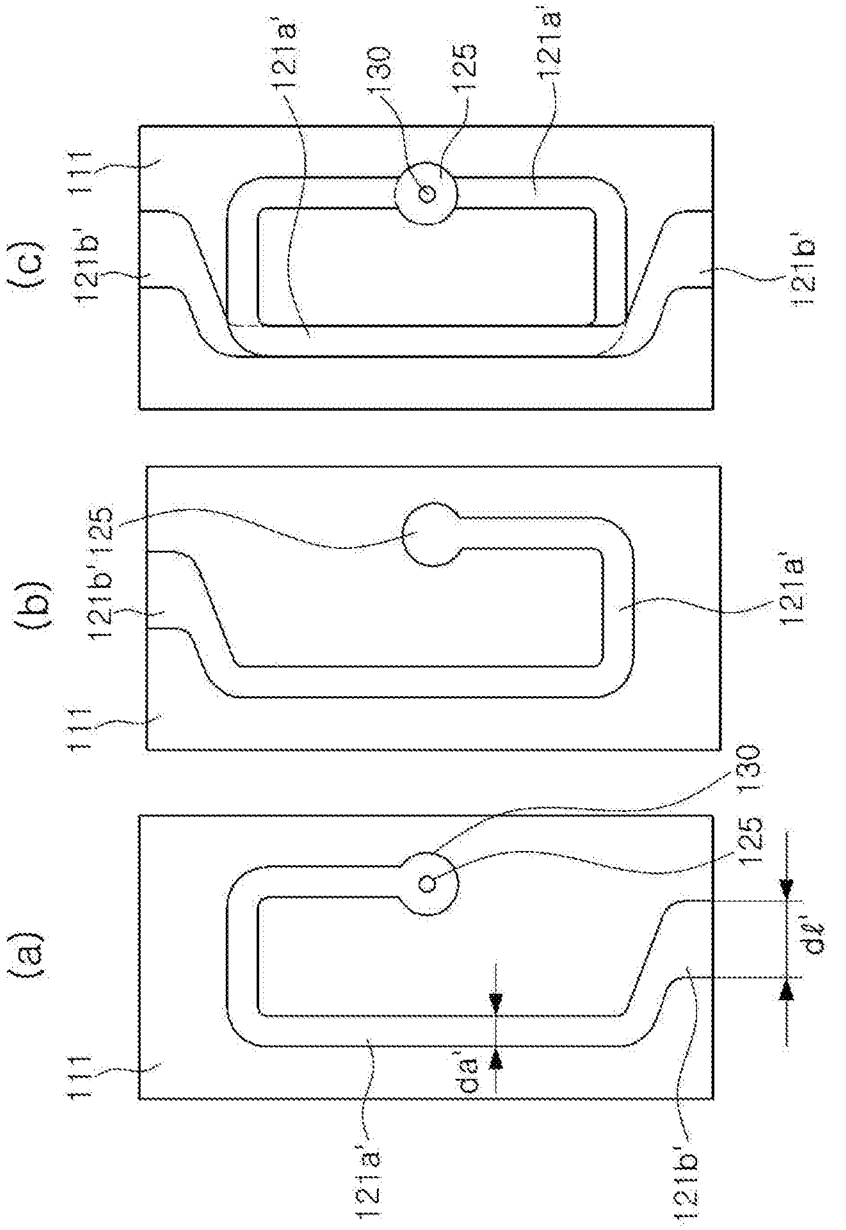
Figure 5:
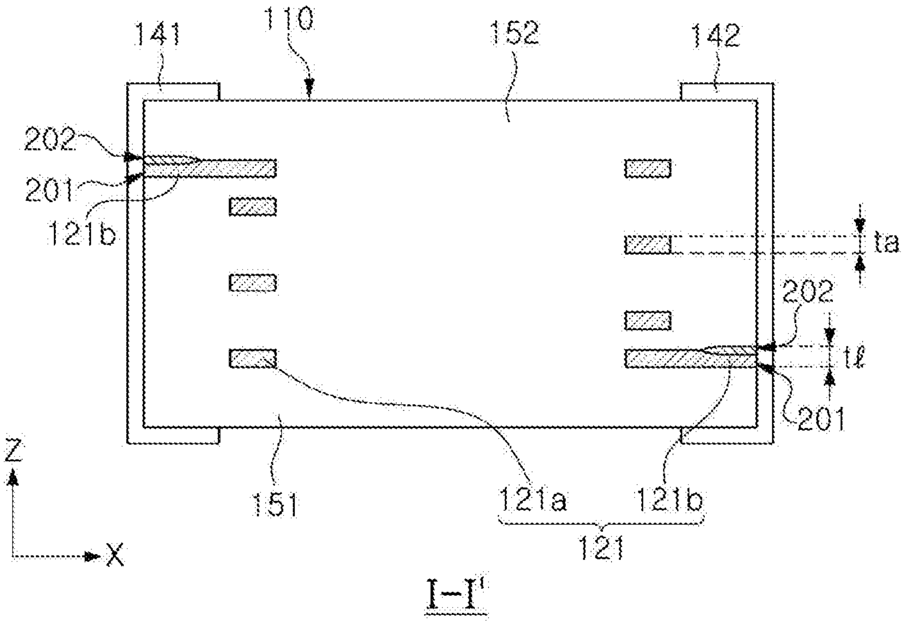
FIG. 5 is a cross-sectional diagram taken along line I-I' in FIG. 1.
Figure 6:
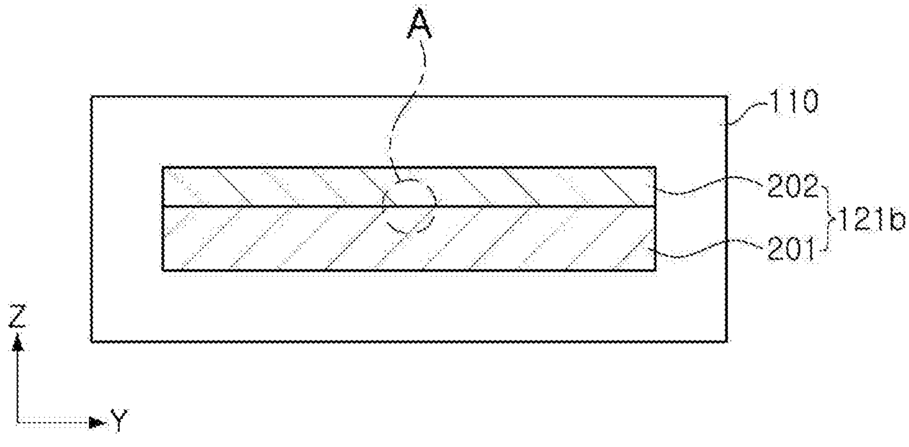
FIG. 6 is a plan diagram illustrating a lead-out pattern and a surrounding region thereof in a coil electronic component illustrated in FIG. 1.
Figure 7:
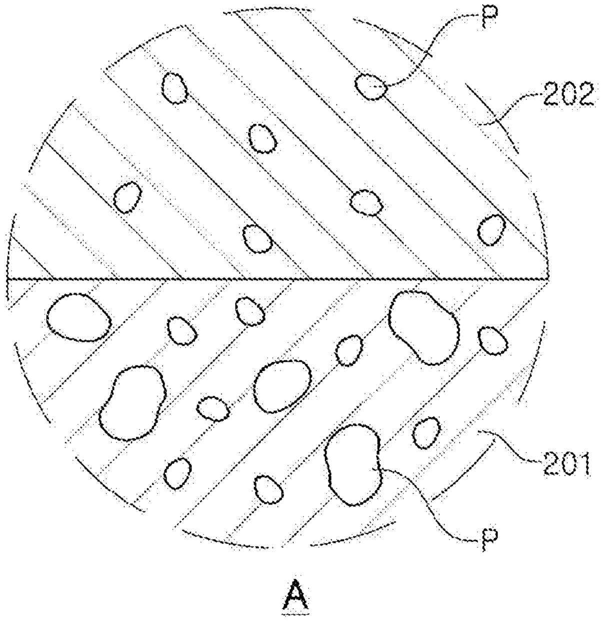
FIG. 7 is a diagram illustrating region A illustrated in FIG. 6 in magnified form.

FIGS. 1 and 2 are a perspective diagram and an exploded perspective diagram, respectively, which illustrate a coil electronic component according to an example embodiment. FIGS. 3 and 4 are plan diagrams illustrating an example of a conductor pattern employable in a coil electronic component illustrated in FIG. 1. FIG. 5 is a cross-sectional diagram taken along line I-I' in FIG. 1. FIG. 6 is a plan diagram illustrating a lead-out pattern and a surrounding region thereof in a coil electronic component illustrated in FIG. 1. FIG. 7 is a diagram illustrating region A illustrated in FIG. 6 in magnified form.

Referring to the diagrams, a coil electronic component 100 may include a body 110 and external electrodes 141 and 142, and a laminate structure formed of a plurality of conductor patterns 121 may be disposed in the body 110. An insulating layer 111 may be disposed between the plurality of conductor patterns 121. In the description below, elements of the coil electronic component 100 will be described in greater detail.

A plurality of the insulating layers 111 may be provided in the body 110, and the insulating layers 111 may be layered in a thickness direction (Z direction in the diagram). The insulating layer 111 may include a magnetic material, such as a ferrite component, for example. As an example of a ferrite component, there may be an $Al_2O_3$ based dielectric, an Mn—Zn based ferrite, an Ni—Zn based ferrite, an Ni—Zn—Cu based ferrite, an Mn—Mg based ferrite, a Ba based ferrite, an Li based ferrite, and the like. The insulating layer 111 may be a sintered body formed of the ferrite components described above. Also, if desired, the insulating layer 111 may include a magnetic metal material power, and as the magnetic metal material power, a crystalline metal or an amorphous metal including one or more elements selected from a group consisting of iron (Fe), silicon (Si), boron (B), chromium (Cr), aluminum (Al), copper (Cu), niobium (Nb), and nickel (Ni) may be used. An example of the magnetic metal material power may be an Fe—Si—B—Cr based amorphous metal. Also, an oxide film may be formed on a surface of the magnetic metal material power such that insulating properties of the magnetic metal material power may be secured.

As illustrated in the diagrams, a first cover layer 151 may be disposed in a lower portion of the body 110, and a second cover layer 152 may be disposed in an upper portion. The cover layers 151 and 152 may protect a conductor pattern 121, and may be formed of the same material as a material of the insulating layer 111, for example.

The external electrodes 141 and 142 may be formed externally of the body 110 and may be electrically connected to the conductor pattern 121. As illustrated in FIG. 3, the first external electrode 141 may be connected to a lead-out pattern 121*b* of an uppermost conductor pattern 121, and the second external electrode 142 may be connected to a lead-out pattern 121*b* of a lowermost conductor pattern 121. Each of the first and second external electrodes 141 and 142 may have a multilayer structure. For example, each of the first and second external electrodes 141 and 142 may include a first layer and a second layer. The first layer may be configured as a sintered electrode obtained by sintering a conductive paste, and the second layer may be configured to cover the first layer and may include one or more plating layers. Also, the first and second external electrodes 141 and 142 may also include other layers in addition to the first layer and the second layer. For example, the first and second external electrodes 141 and 142 may include a conductive resin electrode between the first layer and the second layer to alleviate mechanical impacts, and the like.

The plurality of conductor patterns 121 may include a coil pattern 121*a*, and a spiral coil structure may be formed by layering the coil patterns 121*a*. Also, portions of the plurality of conductor patterns 121, for example, the plurality of conductor patterns 121 disposed in an uppermost portion and a lowermost portion in the example embodiment, may include the lead-out pattern 121*b* connected to the coil pattern 121*a*. The lead-out pattern 121*b* may connect the coil pattern 121*a* and the external electrodes 141 and 142 to each other. The conductor pattern 121 may include a sintered metal body obtained by sintering a conductive paste, and the sintered metal body may include elements having high conductivity such as silver (Ag), palladium (Pd), aluminum (Al), nickel (Ni), titanium (Ti), gold (Au), copper (Cu), platinum (Pt), and the like.

As illustrated in the diagram, a connection pattern 125 may be formed for interlayer connection, and the connection patterns 125 of adjacent coil patterns 121*a* may be connected to each other by a conductive via 130. As a plurality of the coil patterns 121*a* are connected to each other by the conductive via 130, a coil structure may be formed. The conductive via 130 may be formed by forming a through-hole in a portion corresponding to the connection pattern 125 of a magnetic layer 111 and filling the through-hole with a conductive material. In this case, the conductive via 130 may be formed of the same material as a material of a coil pattern 120.

Referring to FIG. 3, in the example embodiment, a width $d_l$ of the lead-out pattern 121*b* may be the same as a width $d_a$ of the coil pattern 121*a*. Alternatively, as illustrated in FIG. 4, a width $d_{l'}$ of a lead-out pattern 121*b*' may be greater than a width $d_{a'}$ of a coil pattern 121*a*', and accordingly, a contact area with the external electrodes 141 and 142 may increase such that direct current resistance may improve.

In the example embodiment, as in the examples illustrated in FIGS. 5 and 6, the lead-out pattern 121*b* may include a first metal layer 201 and a second metal layer 202, and the second metal layer 202 may be disposed on the first metal layer 201. As illustrated in FIG. 7, a pore density of the first metal layer 201 may be higher than a pore density of the second metal layer 202. A pore density may be defined as a volume of pore P present in unit volume of the metal layers 201 and 202.

As described above, the coil pattern 121*a* and the lead-out pattern 121*b* may be obtained by applying a conductive paste and sintering the conductive paste. While a conductive paste is applied, a thickness of the coil pattern 121*a* may become different from a thickness of the lead-out pattern 121*b*. For example, the lead-out pattern 121*b* disposed in an outer region, particularly the first metal layer 201, for example, may be coated in a thickness less than a thickness of the coil pattern 121*a*. Accordingly, even after a sintering process, a thickness of the first metal layer 201 may be less than a thickness of the coil pattern 121*a*. Also, oxidation of metal grains included in a conductive paste may more actively occur in the first metal layer 201, and accordingly, a thickness difference with the coil pattern 121*a* may further increase after a sintering process. When a thickness of the first metal layer 201 decreases as above, direct current resistance, structural stability, and the like, may degrade as a contact area with the external electrodes 141 and 142 decreases. In the example embodiment, the lead-out pattern 121*b* may be configured to have a multilayer structure, and the second metal layer 202 may be formed on the first metal layer 201.

The second metal layer 202 may be provided to reduce a problem caused by a decreased thickness of the lead-out pattern 121*b*, and the second metal layer 202 may be obtained by additionally applying a conductive paste on the conductive paste for forming the first metal layer 201. In this case, the second metal layer 202 may be selectively formed in an outer region of the conductor pattern 121 corresponding to a region in which the lead-out pattern 121*b* is formed, and may be formed by coating a region corresponding to the first metal layer 201 with a conductive paste in a form of dots. To implement the selective coating process, the conductive paste for the second metal layer 202 may include a higher content of metal grains than the conductive paste for the first metal layer 201, and accordingly, the conductive paste for the second metal layer 202 may have lower liquidity than liquidity of the conductive paste for the first metal layer 201. The conductive paste for the second metal layer 202 having lower liquidity may be selectively formed in the region corresponding to the lead-out pattern 121*b* more easily.

As the conductive paste for the second metal layer 202 contains more metal grains, a pore density of the first metal layer 201 may be higher than a pore density of the second metal layer 202 after a sintering process as in the example illustrated in FIG. 7. The conductive paste for the first metal layer 201 may include a greater amount of an organic material such as a binder, and accordingly, the first metal layer 201 may include a more number of pores P than the second metal layer 202 in a sintered structure after a sintering process. An average size of the pores P in the first metal layer 201 may be greater than an average size of the pores P in the second metal layer 202. The pores P may be created during sintering metal grains, the higher the content of an organic material such as a binder in a conductive paste, the more pores may be formed after a sintering process. Portions of the pores P of the first and second metal layers 201 and 202 may be voids. Also, portions of the pores P of the first and second metal layers 201 and 202 may be filled with an organic material. The organic material may be present in a conductive paste, and may partially remain after a sintering process.

In the example embodiment, the lead-out pattern 121*b* may include the two metal layers 201 and 202. However, an example embodiment thereof is not limited thereto, and the number of the metal layers 201 and 202 may increase. In other words, if desired, another metal layer may be disposed on the second metal layer 202 through an additional coating process.

As the lead-out pattern 121*b* includes the second metal layer 202 in addition to the first metal layer 201, a sufficient contact area with the external electrodes 141 and 142 may be secured, thereby improving direct current resistance, structural stability, and the like. The second metal layer 202 may be provided to supplement a thickness of the lead-out pattern 121*b*, and may thus have a relatively decreased thickness. Accordingly, a thickness of the first metal layer 201 may be greater than a thickness of the second metal layer 202. Also, as illustrated in the diagram, a thickness of the coil pattern 121*a* may be less than a sum of thicknesses of the first and second metal layers 201 and 202.

Figure 8:
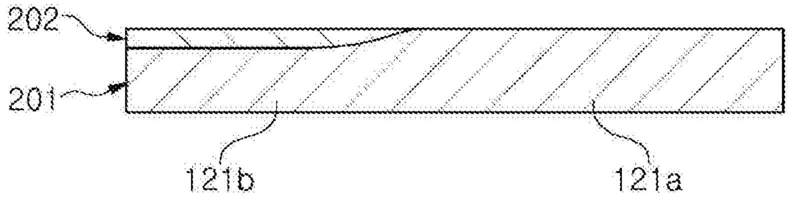
FIGS. 8, 9, and 10 are diagrams illustrating a lead-out pattern employable in a coil electronic component according to a modified example.
Figure 9:
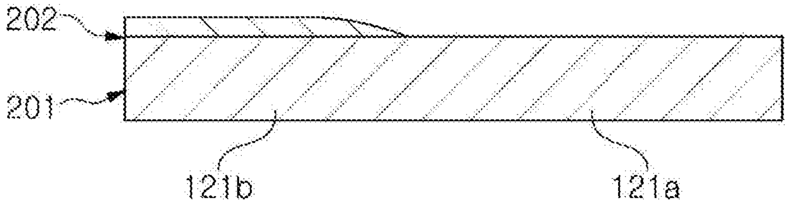
Figure 10:
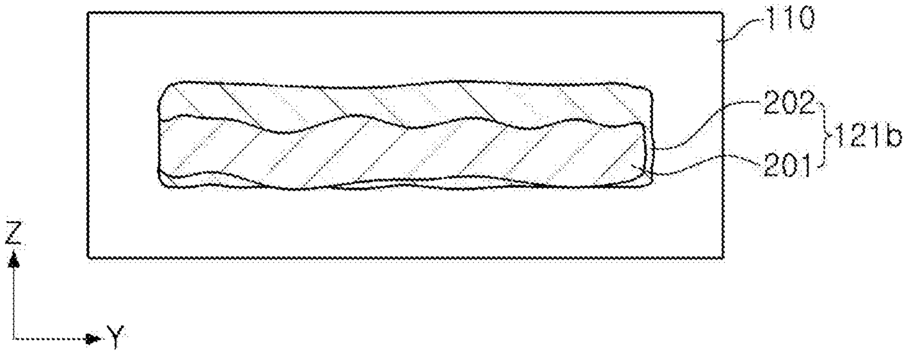

A lead-out pattern employable in a coil electronic component will be described in accordance with a modified example with reference to FIGS. 8, 9, and 10. As in the example embodiment illustrated in FIG. 8, a thickness of a coil pattern 121*a* may be the same as a sum of thicknesses of first and second metal layers 201 and 202. In other words, by additionally forming the second metal layer 202, a thickness of the lead-out pattern 121*b* may be the same as a thickness of the coil pattern 121*a*. Also, in the aforementioned example embodiment, a thickness of the first metal layer 201 may be less than a thickness of the coil pattern 121*a*, but an example embodiment thereof is not limited thereto. The additionally formed second metal layer 202 may also be applied in an example in which a thickness of the first metal layer 201 is the same as a thickness of the coil pattern 121*a* as in the example embodiment illustrated in FIG. 9. Accordingly, by including the first and second metal layers 201 and 202, a thickness of the lead-out pattern 121*b* may be greater than a thickness of the coil pattern 121*a*.

In the aforementioned example embodiment, the second metal layer 202 may only be formed on an upper surface of the first metal layer 201, but a portion of the second metal layer 202 may also cover a different region of the first metal layer 201. As in the modified example illustrated in FIG. 10, portions of the second metal layer 202 may cover at least portions of side surfaces and a lower surface of the first metal layer 201. As metal grains are sintered, the first metal layer 201 may be contracted such that an empty space may be formed between the body 110 and the first metal layer 201, and by applying the second metal layer 202, at least a portion of the empty space may be filled. Accordingly, an area of the lead-out pattern 121*b* exposed from the body 110 may effectively increase.

In the description below, an example of a process of manufacturing a coil electronic component 100 having the above-described structure, particularly a process of forming a conductor pattern, will be described with reference to FIGS. 11 and 12 for understanding the structure of the coil electronic component 100.

Figure 11:
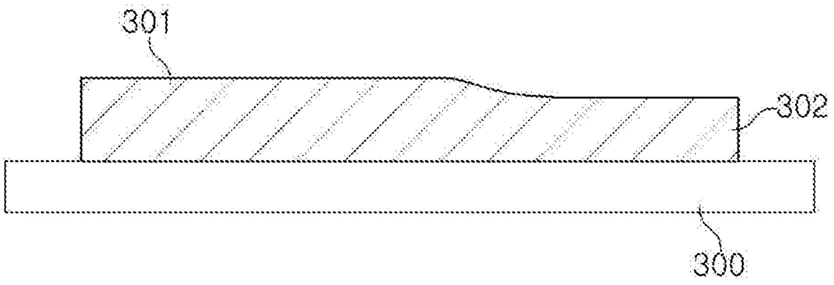
FIGS. 11 and 12 are diagrams illustrating a method of manufacturing a coil electronic component in accordance with an example embodiment.

As illustrated in FIG. 11, a paste coating material may be formed by applying a conductive paste for a conductor pattern on an insulating layer 300, and the paste coating material for a conductor pattern may be divided into a coil pattern region 301 and a first metal layer region 302 in a lead-out pattern region. The insulating layer 300 may be provided in a form of a green sheet including magnetic grains such as ferrite, and may be a slurry including ferrite grains, a binder, a solvent, and the like. The paste coating material for a conductor pattern may be formed by applying a paste of conductive grains of elements such as silver (Ag), palladium (Pd), aluminum (Al), nickel (Ni), titanium (Ti), gold (Au), copper (Cu), platinum (Pt), and the like, on the insulating layer 300. A coating thickness of the first metal layer region 302 may be less than a coating thickness of the coil pattern region 301, and the thicknesses may be configured as above, intentionally or unintentionally, while performing the paste coating process. Also, as described above, it may not be necessary to configure a coating thickness of the first metal layer region 302 to be less than a coating thickness of the coil pattern region 301, and thicknesses of the two regions 301 and 302 may be the same.

Figure 12:
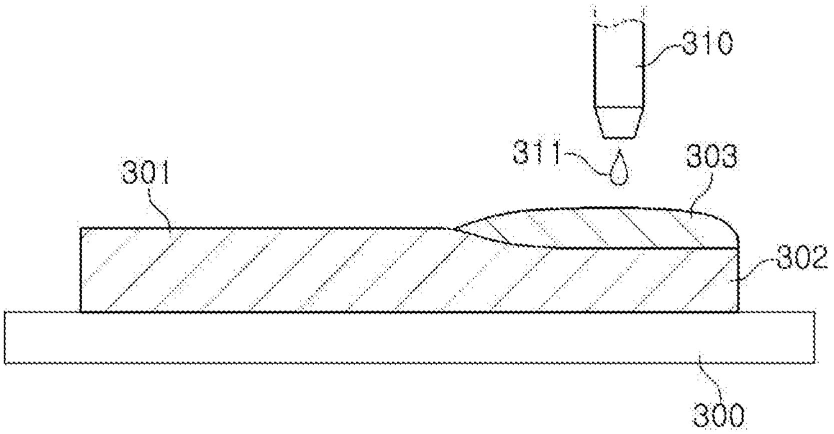

As illustrated in FIG. 12, a second metal layer region 303 may be formed to secure a sufficient thickness of the lead-out pattern, and the second metal layer region 303 may be obtained by locally applying a paste having relatively low liquidity. As an example, the second metal layer region 303 may be formed by selectively applying a paste 311 having low liquidity from a dispenser 310. When the second metal layer region 303 is formed by the selective coating process, a sufficient thickness of the lead-out pattern may be secured without unnecessarily increasing a thickness of the coil pattern region 301, and accordingly, a size of the component may be reduced, and process efficiency may improve. As the paste for forming the second metal layer region 303, a paste having a higher content of metal grains than a content of metal grains of the paste for forming the first metal layer region 302 may be used to reduce liquidity. Accordingly, a pore density of a second metal layer may be less than a pore density of a first metal layer in a fine structure after a sintering process. A coated form of the second metal layer region 303 may not be necessarily the same as that of the first metal layer region 302, and the second metal layer region 303 may be formed on a portion of an upper surface of the first metal layer region 302. Also, the second metal layer region 303 may cover a broader region beyond the upper surface of the first metal layer region 302, and accordingly, a structure similar to the example illustrated in FIG. 10 may be obtained.

A plurality of the insulating layers 300 and the paste coating material for a conductor pattern obtained by the above-described method may be formed, may be layered and pressured, and may be sintered. Accordingly, the insulating layers 300 and the paste coating material may become dense, and after a sintering process, a lead-out pattern 121*b* may have a sufficient thickness and may be stably combined with the external electrodes 141 and 142.

The inventors of the present disclosure compared direct current resistance (Rdc) of the example in which the coil electronic component has the lead-out pattern obtained through the additional coating process with direct current resistance (Rdc) of an example of a general coil electronic component. Table 1 below lists the result of the experimentation, and a line width of a coil pattern in the coil electronic component used in the experimentation was 110 μm. As for comparative examples, a coating process was applied once, and a thickness of coated paste was with reference to a thickness of a coil pattern region. In embodiments, the coil pattern and the first metal layer region were coated in 16 μm, and the paste was additionally coated on the lead-out pattern region in 2 μm, thereby forming the second metal layer region.

TABLE 1

| | Paste Coating | Direct Current Resistance (mΩ) | | |
|---|---|---|---|---|
| | Thickness (μm) | Minimum | Maximum | Average |
| Comparative Example 1 | 12 | 246.7 | 300.8 | 273.8 |
| Comparative Example 2 | 14 | 221.3 | 279.7 | 251.3 |
| Comparative Example 3 | 16 | 198.1 | 258.1 | 228.8 |
| Comparative Example 4 | 18 | 171.2 | 223.3 | 197.4 |
| Comparative Example 5 | 20 | 154.2 | 199.9 | 177.1 |
| Embodiment | 16 + 2 | 168.3 | 219.8 | 194.7 |

As indicated in Table 1, in the embodiment, direct current resistance was more improved than in the comparative examples in which the paste was coated once in 16 μm. Also, in comparative example 4 in which the paste was coated once in 18 μm, direct current resistance was slightly decreased as compared to the embodiment in which the paste was coated in 16 μm and was locally coated in 2 μm additionally.

According to the aforementioned example embodiments, by using the coil element component configured as above, direct current resistance may be reduced, and structural stability may improve.

While the exemplary embodiments have been shown and described above, it will be apparent to those skilled in the art that modifications and variations could be made without departing from the scope of the present invention as defined by the appended claims.

What is claimed is:

1. A coil electronic component, comprising:

a body including a laminate structure including a plurality of conductor patterns disposed therein, and an insulating layer disposed between the plurality of conductor patterns; and an external electrode disposed on the body, wherein portions of the plurality of conductor patterns comprise a coil pattern and a lead-out pattern connecting the coil pattern and the external electrode to each other, and wherein the lead-out pattern comprises a first metal layer and a second metal layer disposed on the first metal layer, and a pore density of the first metal layer is higher than a pore density of the second metal layer.

2. The coil electronic component of claim 1, wherein a thickness of the coil pattern is greater than a thickness of the first metal layer.

3. The coil electronic component of claim 1, wherein a thickness of the first metal layer is greater than a thickness of the second metal layer.

4. The coil electronic component of claim 1, wherein a thickness of the coil pattern is less than a sum of thicknesses of the first and second metal layers.

5. The coil electronic component of claim 1, wherein a thickness of the coil pattern is the same as a sum of thicknesses of the first and second metal layers.

6. The coil electronic component of claim 1, wherein a thickness of the coil pattern is the same as a thickness of the first metal layer.

7. The coil electronic component of claim 1, wherein the insulating layer comprises a sintered ferrite body.

8. The coil electronic component of claim 1, wherein the lead-out pattern comprises a sintered metal body.

9. The coil electronic component of claim 8, wherein the sintered metal body comprises an Ag component.

10. The coil electronic component of claim 1, wherein portions of pores of the first and second metal layers are voids.

11. The coil electronic component of claim 1, wherein portions of pores of the first and second metal layers are filled with an organic material.

12. The coil electronic component of claim 1, wherein a portion of the second metal layer covers at least portions of side surfaces and a lower surface of the first metal layer.

13. The coil electronic component of claim 1, wherein a width of the lead-out pattern is greater than a width of the coil pattern.

14. The coil electronic component of claim 1, wherein the second metal layer is composed of a material different from the first metal layer.

15. The coil electronic component of claim 14, wherein the first metal layer and the coil pattern are composed of the same material.

16. The coil electronic component of claim 1, wherein an average size of pores in the first metal layer is greater than an average size of pores in the second metal layer.

* * * * *